United States Patent [19]

Hashimoto

[11] Patent Number: 4,751,681
[45] Date of Patent: Jun. 14, 1988

[54] DYNAMIC DIFFERENTIAL AMPLIFIER

[75] Inventor: Masashi Hashimoto, Ibaragi, Japan

[73] Assignee: Texas Instruments Incorporated, Dallas, Tex.

[21] Appl. No.: 896,989

[22] Filed: Aug. 15, 1986

[30] Foreign Application Priority Data

Aug. 23, 1985 [JP] Japan .................................. 60-185235

[51] Int. Cl.$^4$ ......................... G11C 11/40; G11C 13/00
[52] U.S. Cl. ..................................... 365/207; 365/189; 365/210
[58] Field of Search ................. 365/189, 207, 210, 230

[56] References Cited

U.S. PATENT DOCUMENTS 4,613,957 9/1986 Iwahashi .............................. 365/207

Primary Examiner—Terrell W. Fears
Attorney, Agent, or Firm—George Craig; James T. Comfort; Melvin Sharp

[57] ABSTRACT

A semiconductor memory device comprising a plurality of bit lines and a plurality of dummy bit lines respectively associated with the bit lines, a plurality of memory cells arranged in association with each of the bit lines, a dummy cell arranged in association with each of the dummy bit lines, and a sense amplifier. The sense amplifier comprises a differential amplifier network responsive to a first activating signal for comparing the potential at one of the bit lines with the potential at the associated one of the dummy bit lines and producing one of two complementary signals selectively depending upon the relationship between the potentials compared, and a signal latch network responsive to a second activating signal and to each of the complementary signals output from the differential amplifier network the for producing one of two output signals respectively corresponding to the complementary signals from the differential amplifier means, the signal latch network being operative to have the aforesaid one of the output signals latched therein for a controlled period of time after the particular output signal has been produced by the signal latch network.

10 Claims, 5 Drawing Sheets

DYNAMIC DIFFERENTIAL AMPLIFIER

FIELD OF THE INVENTION

The present invention relates to a semiconductor memory device and, more particularly, to a dynamic sense amplifier for use in a memory device implemented on a semiconductor integrated circuit chip.

BACKGROUND OF THE INVENTION

A known dynamic sense amplifier for a semiconductor memory device is designed to detect the slight difference between the potentials at a bit line and the associated dummy bit line from the amplified difference between the potentials at suitable sense nodes respectively associated with but isolated in effect from the particular bit line and associated dummy bit line. The sense nodes being thus not directly connected to the bit line and dummy bit line, the memory device will seldom err in reading the information represented by the potentials at the bit line and dummy bit line as would otherwise be caused due to, for example, a difference in stray capacitance between the lines. A semiconductor memory device is required to retain its output signal for a certain period of time during each readout cycle of the device to permit external units to operate properly in response to the information output from the memory device. The difference produced between the potentials at the sense nodes during each readout cycle of the device must be maintained throughout this period of time at a level correctly indicating the information read from the selected memory cell. It is for this reason required to have the sense amplifier of the memory device maintained active throughout such a period of time. This results in dissipation of a large amount of power and accordingly in generation of a large amount of heat during each cycle of operation of the device.

It is accordingly a prime object of the present invention to provide a semiconductor memory having an improved sense amplifier which may be maintained active for a reduced period of time during each readout cycle of the device.

The present invention contemplates resolution of such a problem through provision of an improved semiconductor memory device featuring, inter alia, a sense amplifier which may be maintained active for a significantly reduced period of time during each readout cycle of the device.

SUMMARY OF THE INVENTION

In accordance with the present invention, there is provided a semiconductor memory device comprising (a) a plurality of first lines and a plurality of second lines respectively associated with the first lines, (b) a plurality of memory cells arranged in association with each of the first lines, (c) a dummy cell arranged in association with each of the second lines, (d) differential amplifier means responsive to a first activating signal for comparing the potential at one of the first lines with the potential at the associated one of the second lines and producing one of two substantially complementary signals selectively depending upon the relationship between the potentials compared, and (e) signal latch means responsive to a second activating signal and to each of the complementary signals for producing one of two output signals respectively corresponding to the complementary signals produced by the differential amplifier means, the signal latch means being operative to have the aforesaid one of the output signals latched therein for a controlled period of time after the particular output signal has been produced by the signal latch means.

In a more specific form of semiconductor memory device thus constructed and arranged in accpordance with the present invention, the differential amplifier means has two output terminals between which one of the aforesaid substantially complementary signals are to appear selectively and the signal latch means comprises (1) first and second output nodes between which the aforesaid one of the output signals latched in the signal latch means is to appear, (2) first and second input transistors each having an input terminal, an output terminal and a control terminal, the control terminals of the first and second input transistors being respectively connected to the output terminals of the differential amplifier means and the input terminals of the first and second input transistors being connected to the first and second output nodes, respectively, (3) first and second feedback transistors each having an input terminal, an output terminal and a control terminal, the input terminal of each of the first and second feedback transistors being connected to a first voltage source, the output terminals of the first and second feedback transistors being connected to the input terminals of the first and second input transistors through the first and second output nodes, respectively, and the control terminals of the first and second feedback transistors being connected to the second and first output nodes, respectively, (4) third and fourth feedback transistors each having an input terminal, an output terminal and a control terminal, the input terminals of the third and fourth feedback transistors being connected to the output terminals of the first and second input transistors, respectively, and the control terminals of the third and fourth feedback transistors being connected to the second and first output nodes, respectively, and (5) a discharge transistor having an input terminal connected to the output terminals of the third and fourth feedback transistors, an output terminal connected to a second voltage source, and a control terminal connected to a source of the second activating signal. The signal latch means may further comprise (6) first and second precharge transistors each having an input terminal, an output terminal and a control terminal, the input terminal of each of the first and second precharge transistors being connected to the first voltage source, the output terminals of the first and second precharge transistors being connected to the input terminals of the first and second input transistors through the first and second output nodes, respectively, and the control terminals of the first and second precharge transistors being connected to a source of a precharge enable signal.

BRIEF DESCRIPTION OF THE DRAWINGS

The drawbacks of a prior-art sense amplifier and the features and advantages of a dynamic sense amplifier according to the present invention will be more clearly understood from the following description taken in conjunction with the accompanying drawings in which like reference numerals designate similar or corresponding units and elements and in which.

Figure 1:
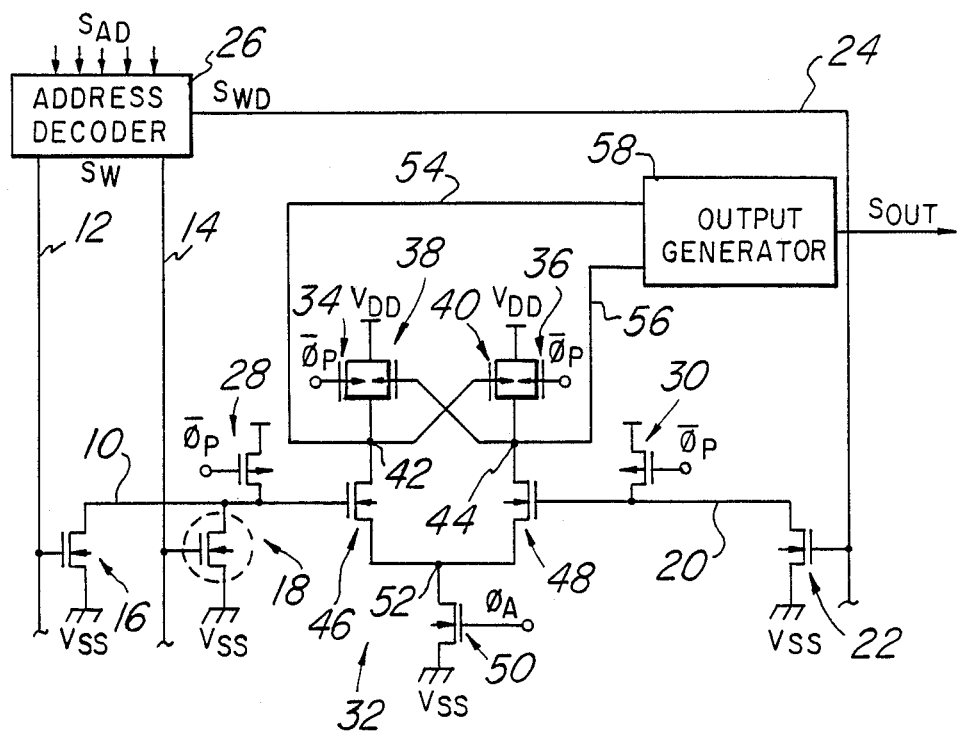
FIG. 1 is a circuit diagram showing the circuit arrangement of a semiconductor read only memory device including a prior-art dynamic sense amplifier, FIG.
Figure 2:
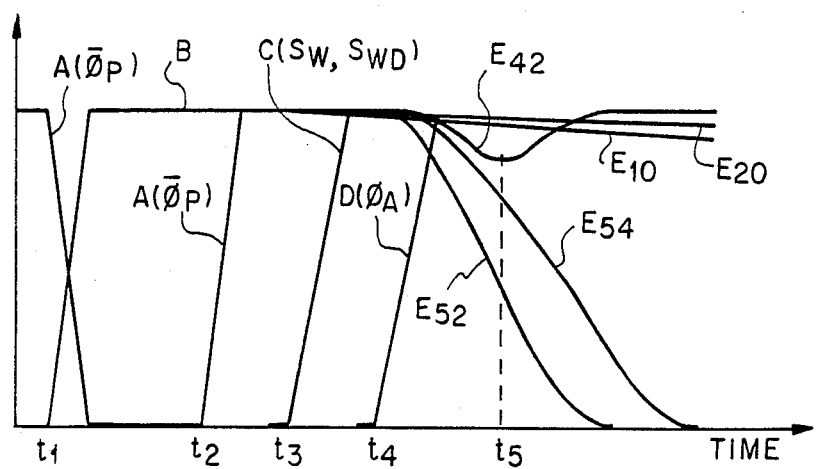
Figures 3, 3A:
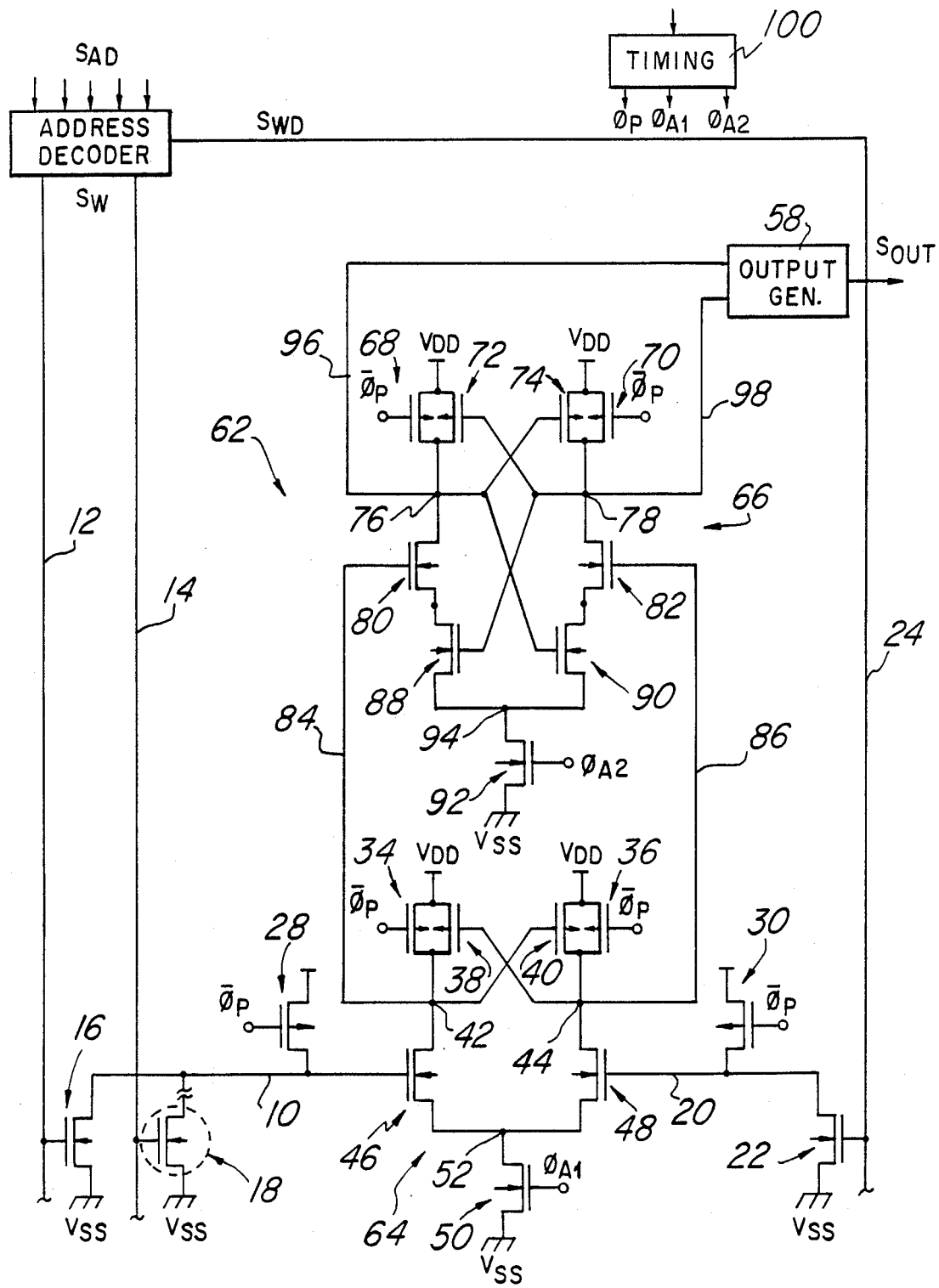
Figure 4:
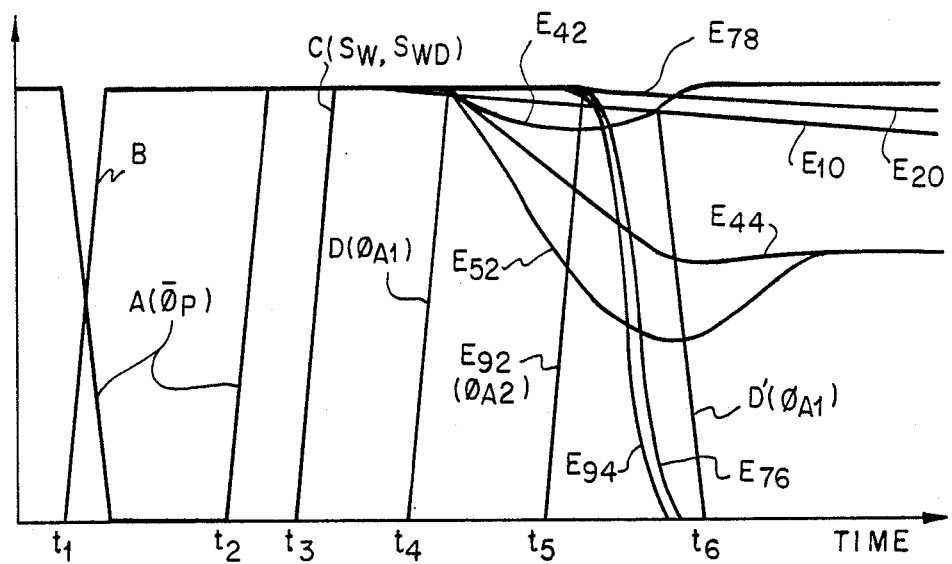
Figure 5:
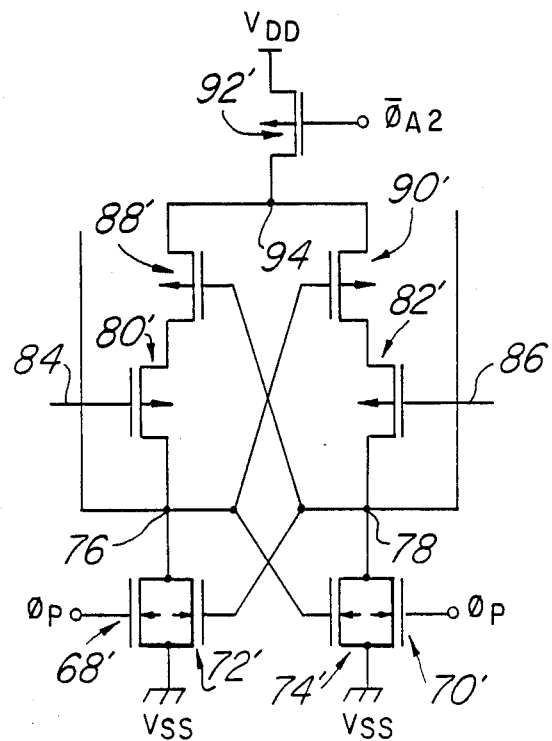
Figure 6:
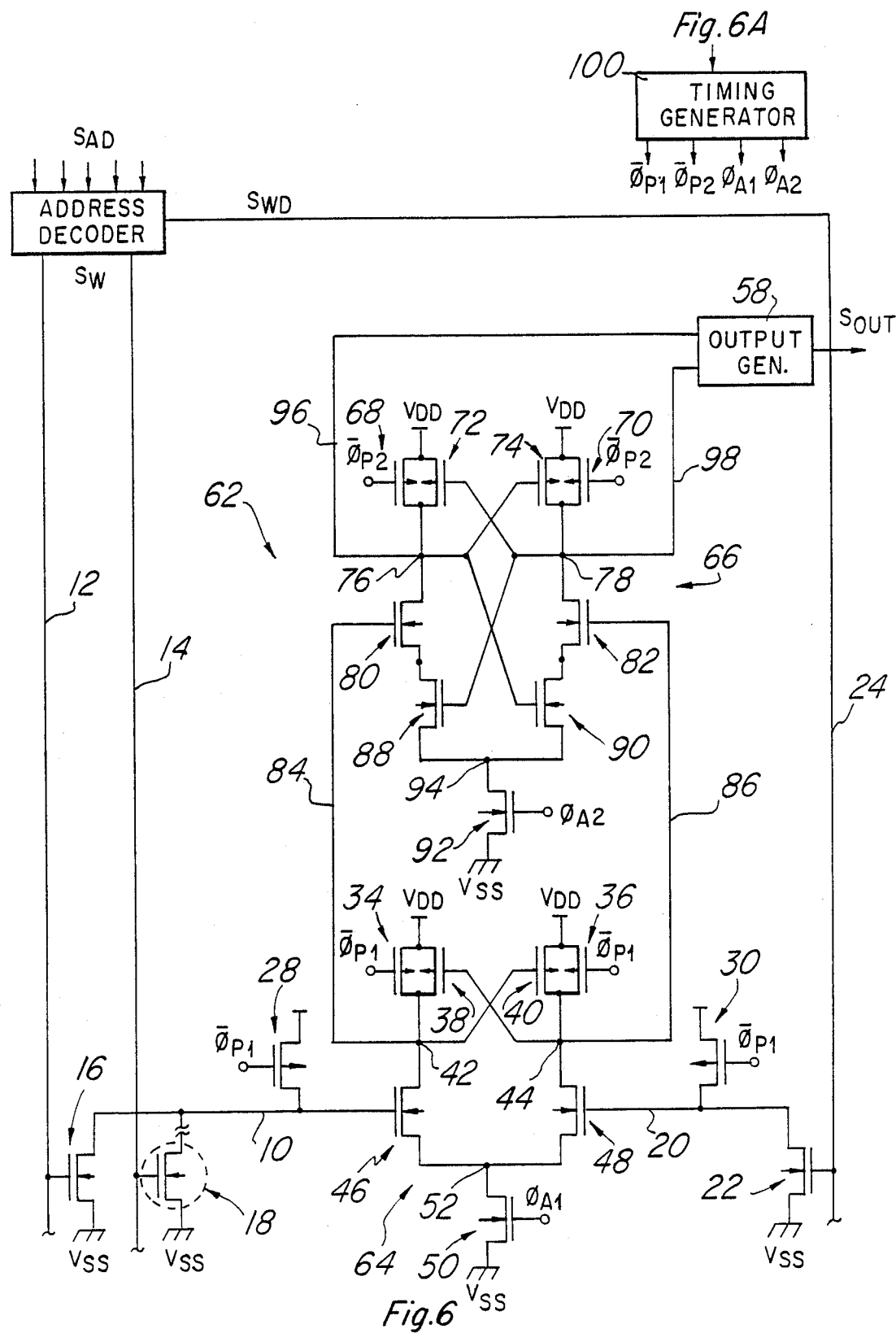
Figure 7:
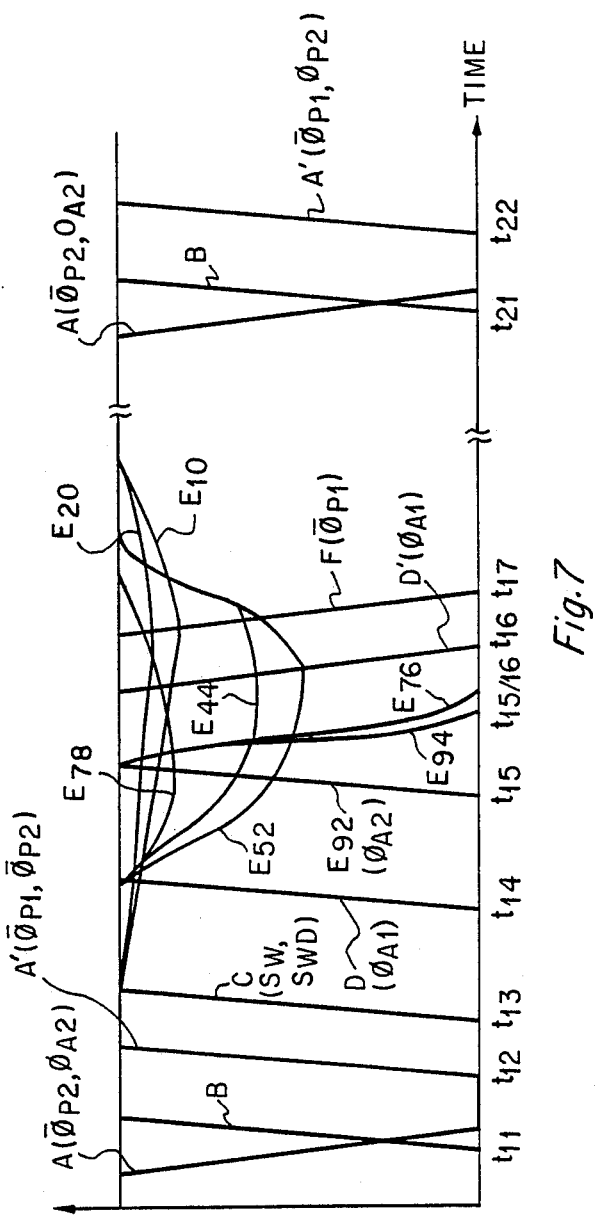

1A showing a timing generator circuit forming part of the memory device illustrated in FIG. 1;

FIG. 2 is a timechart showing examples of the waveforms of various signals to appear in the circuit arrangement of the memory device shown in FIG. 1;

FIG. 3 is a circuit diagram showing the circuit arrangement of a first preferred embodiment of a semiconductor memory device according to the present invention, FIG. 3A showing a timing generator circuit forming part of the memory device illustrated in FIG. 3;

FIG. 4 is a timechart showing examples of the waveforms of various signals to appear in the circuit arrangement of the memory device shown in FIG. 3;

FIG. 5 is a circuit diagram showing part of the circuit arrangement of a second preferred embodiment of a semiconductor memory device according to the present invention;

FIG. 6 is a circuit diagram showing the circuit arrangement of a third preferred embodiment of a semiconductor memory device according to the present invention, FIG. 6A showing a timing generator circuit forming part of the memory device illustrated in FIG. 6; and FIG. 7 is a timechart showing examples of the waveforms of various signals to appear in the circuit arrangement of the memory device shown in FIG. 6.

DESCRIPTION OF THE PRIOR ART

In FIG. 1 of the drawings, a read only memory device using a known dynamic sense amplifier is shown including a memory cell array of matrix form having a plurality of bit lines and a plurality of word lines. In the arrangement herein shown, the bit lines are represented by a single bit line 10 and the word lines represented by two adjacent word lines 12 and 14. Each of the bit lines 10, . . . is connected to a row of memory cells such as the row including memory cells 16 and 18 connected to the bit line 10 and each of the word lines 12, 14, . . . is connected to a column of memory cells such as the column including the cell 16 connected to the word line 12 or the column including the cell 18 connected to the word line 14 as shown.

The read only memory device herein shown is assumed to be of the mask type by way of example and has fixedly memorized therein a set of data in the form of binary logic states "0" and "1". The memory cells forming the cell array of the memory device are thus broken down to two major categories, one consisting of memory cells each storing a logic "0" bit of data and the other consisting of memory cells each storing a logic "1" bit of data. Of the particular two memory cells 16 and 18 in the shown arrangement, the memory cell 16 is assumed to be of the type storing a logic "0" bit of data while the memory cell 18 is assumed to be of the type storing a logic "1" bit of data and is shown enclosed within a circle in broken line. Each memory cell of the type storing a logic "0" bit of data such as the cell 16 is implemented by an n-channel metal-oxide-semiconductor (MOS) field-effect transistor having a gate oxide layer which is thin enought to enable the transistor to create a channel region between the source and drain thereof in the presence of a gate voltage and accordingly act as a field-effect device. On the other hand, each memory cell of the type storing a logic "1" bit of data such as the cell 18 is implemented by a device having a gate oxide layer which is thickened so that there can not be created a channel region therein in the presence of a gate voltage. The field-effect transistors forming the logic "0" storing memory cells provided along each of the bit lines 10, . . . have their drains jointly connected to the particular bit line, their gates connected to the respectively associated word lines 12, 14, . . . , and their sources connected to a common ground line ($V_{SS}$). Thus, the n-channel field-effect transistor forming the logic "0" storing memory cell 16 provided along the bit line 10 has its drain connected to the bit line 10, its gate connected to the word line 12 and its source connected to the ground line. The logic "1" storing memory cell 18 is also shown consisting of an n-channel field-effect transistor having its drain connected to the bit line 10, its gate connected to the associated word line 14, and its source connected to the ground line. The device forming the memory cell 18 is however inoperable for providing field-effect transistor functions with no channel region produced in the presence of a gate voltage at the word line 14.

The memory device shown in FIG. 1 further includes a plurality of dummy bit lines respectively associated with the individual bit lines 10, . . . and represented by a single dummy bit line 20 associated with the bit line 10. In association with each of these dummy bit lines 20, . . . is provided a dummy cell herein represented by a dummy cell 22 implemented by an n-channel field-effect transistor having its drain connected to the dummy bit line 20, its source connected to the ground line, and its gate connected to a dummy word line 24 as shown. The field-effect transistor forming the dummy cell 22 has the geometry of its channel region selected to provide a channel conductance approximately equal to one half of the channel conductance of each of the field-effect transistors forming the memory cell storing a logic "0" bit of data such as the transistor 16.

The individual word lines 12, 14, . . . and the dummy word line 24 are connected to output terminals of a row address decoder 26. The row address decoder 26 is responsive to row address signals $S_{AD}$ which appear at input terminals of the decoder circuit and produces an active-high row select signal $S_W$ to select any one of the word lines 12, 14, . . . in addition to an active-high signal $S_{WD}$ to activate the dummy word line 24 during each readout cycle of the memory device. Though not shown in the drawings, the bit lines 10, . . . and the dummy bit lines 20, . . . are also connected to a column address decoder to select any one of the bit lines 10, . . . as well as the associated dummy bit line during each readout cycle of the device. Each of the bit lines 10, . . . is further connected to a precharge transistor represented by a field-effect transistor 28 provided in association with the bit line 10 in the shown arrangement. The precharge transistor 28 has its drain connected to a voltage supply line for a positive supply voltage $V_{DD}$ (of, for example, 5 volts), its gate connected to a first clock supply line for an active-low clock signal $\bar{\phi}_P$, and its source connected to the bit line 10. For each of the dummy bit lines is also provided a precharge transistor represented by a field-effect transistor 30 connected to the shown dummy bit line 20. The dummy bit line 30 also has its drain connected to the voltage supply line for the supply voltage $V_{DD}$, its gate connected to the clock supply line for the clock signal $\bar{\phi}_P$, and its source connected to the dummy bit line 20. Each of these precharge transistors 28 and 30 is provided by a p-channel MOS field-effect transistor and is to be activated by the clock signal $\bar{\phi}_P$ of a low level.

The prior-art memory device shown in FIG. 1 further includes a sense amplifier 32 provided between the bit line 10 and dummy bit line 20. The sense amplifier 32 comprises first and second precharge transistors 34 and 36 and first and second feedback transistors 38 and 40, each of the transistors 34, 36, 38 and 40 being provided by a p-channel MOS field-effect transistor. The first and second precharge transistors 34 and 36 have their drains connected to the voltage supply line for the supply voltage $V_{DD}$, their gates connected to the clock supply line for the clock signal $\bar{\phi}_P$, and their sources connected to first and second sense nodes 42 and 44, respectively. Each of the precharge transistors 34 and 36 is to be also activated by the clock signal $\bar{\phi}_P$ of a low level. The feedback transistors 38 and 40 have their drains connected to the voltage supply line the supply voltage $V_{DD}$, their gates connected to the second and first sense nodes 44 and 42, respectively, and their sources connected to the first and second sense nodes 42 and 44, respectively. Thus, the respective sources of the first precharge and feedback transistors 34 and 38 are commonly connected through the first sense node 42 to the gate of the second feedback transistor 40 and, likewise, the respective sources of the second precharge and feedback transistors 36 and 40 are commonly connected through the second sense node 44 to the gate of the first feedback transistor 38.

The sense amplifier 32 further includes first and second differential amplifier transistors 46 and 48 each of which is provided by an n-channel MOS field-effect transistor. The first and second differential amplifier transistors 46 and 48 have their drains respectively connected to the first and second sense nodes 42 and 44, their gates respectively connected to the bit line 10 and dummy bit line 20, and their sources commonly connected to the ground line through a discharge transistor 50. The discharge transistor 50, which is also provided by an n-channel MOS field-effect transistor, has its drain connected to the respective sources of the first and second differential amplifier transistors 46 and 48 through a common node 52, its gate connected to a second clock supply line for an active-high clock signal $\phi_A$, and its source connected to the ground line. The discharge transistor 50 is to be activated by the clock signal $\phi_A$ of a high level.

The first and second sense nodes 42 and 44 are connected via lines 54 and 56, respectively, to input terminals of an output generator circuit 58 which is operative to compare the potentials at the first and second sense nodes 42 and 44 with each other to produce an output signal $S_{OUT}$ depending upon the result of the comparison. The first and second clock supply lines for the clock signals $\bar{\phi}_P$ and $\phi_A$ are connected to output terminals of a timing generator circuit 60 which is adapted to produce various timing signals including the clock signals $\bar{\phi}_P$ and $\phi_A$, as shown in FIG. 1A.

Operation of the prior-art memory device thus constructed and arranged will now be described with reference to FIGS. 1 and 1A and further to FIG. 2.

In response to an access request signal supplied from an external source such as typically a microprocessor (not shown), the memory device is initiated into action to read out the information stored in any of the memory cells of the device. The clock signal $\bar{\phi}_P$ present at the first clock supply line leading from an output terminal of the timing generator circuit 60 now swings to a low level at time $t_1$, as indicated by plot "A" in FIG. 2. The clock signal $\bar{\phi}_P$ of the low level is supplied as an active-low precharge enable signal to the gate of each of the precharge transistors 28 and 30 connected to the bit lines 10, . . . and to the gate of each of the first and second precharge transistors 34 and 36 of the sense amplifier 32. The clock signal $\bar{\phi}_P$ of the low level supplied to the gates of the precharge transistors 28 and 30 drives each of these transistors 28 and 30 to turn on. Each of the bit line 10 and dummy bit line 20 thus begins to be precharged through the transistors 28 and 30 toward a potential approximately equal to the supply voltage $V_{DD}$ (of, for example, 5 volts), as indicated by plot "B" in FIG. 2. Similarly, the clock signal $\bar{\phi}_P$ of the low level supplied to the gates of the precharge transistors 34 and 36 of the sense amplifier 32 drives each of these transistors 34 and 36 to turn on so that the first and second sense nodes 42 and 44 are precharged through the transistors 34 and 36 to a potential approximating the supply voltage $V_{DD}$, as also indicated by plot "B" in FIG. 2.

The potential at the common node 52 between the respective sources of the first and second differential amplifier transistors 46 and 48 is maintained at ground level $V_{SS}$ before time time $t_1$ with the discharge transistor 50 turned on during the last readout cycle of the memory device. As the potentials at the bit line 10 and dummy bit line 20 and the potentials at the first and second sense nodes 42 and 44 rise toward the supply voltage $V_{DD}$ through the precharge transistors 28, 30, 34 and 36, respectively, a current begins to flow between the drain and source of each of the differential amplifier transistors 46 and 48. It therefore follows that the potential at the common node 52 also begines to rise toward the supply voltage $V_{DD}$, as indicated by plot "B" in FIG. 2. When the bit line 10 and dummy bit line 20 and the nodes 42, 44 and 52 are fully precharged by time $t_2$, the clock signal $\bar{\phi}_P$ swings to a high level so that the potentials at the lines 10 and 20 and nodes 42, 44 and 52 thereafter float at high levels approximating the supply voltage $V_{DD}$.

On the other hand, there a row address signal $S_{AD}$ appearing at the input terminals of the row address decoder 26, which thus produces a row select signal $S_W$ of a high level to select any one of the word lines 12, 14, . . . in addition to a signal $S_{WD}$ to activate the dummy word line 24. For purposes of description, it is herein assumed that the row select signal $S_W$ currently produced from the row address decoder 26 is supplied to the word line 12 with the bit line 10 selected by a column select signal supplied from the column address decoder (not shown). The word line 12 being thus selected, the row select signal $S_W$ of a high level is supplied to the word line 12 and concurrently the signal $S_{WD}$ of a high level is supplied to the dummmy word line 24 at time $t_3$, as indicated by plot "C" in FIG. 2 with the result that the transistor forming the logic "0" storing memory cell 16 and the transistor forming the dummy cell 24 are driven to turn on. The transistors forming the memory cell 16 and dummy cell 24 being thus turned on, the bit line 10 and dummy bit line 20 are connected to the ground line so that the charges which have been stored in the gate oxide layer of each of the field-effect transistors forming the cells 16 and 24 begin to flow to the ground line. Because, in this instance, of the fact that the channel conductance of the transistor forming the dummy cell 24 approximately equals one half of that of the transistor forming the memory cell 16 as previously noted, the potential at the dummy bit line 20 drops at a rate approximately equal to one half of the rate at which the potential at the bit line 10 drops.

The clock signal $\phi_4$ on the second clock supply line leading from another output terminal of the timing generator circuit 60 then shifts to a high level and is supplied as an active-high activating signal to the gate of the discharge transistor 50 at time $t_4$, as indicated by plot "D" in FIG. 2. The discharge transistor 50 is now turned on so that the potential at the common node 52 begins to drop from the level approximating the supply voltage $V_{DD}$ toward the ground level $V_{SS}$ through the transistor 50 as will be seen from curve $E_{52}$ in FIG. 2. The first differential amplifier transistor 46 is thus turned on when the voltage between the common node 52 and the bit line 10 reaches the threshold voltage of the transistor 46 and, likewise, the second differential amplifier transistor 48 is turned on when the voltage between the common node 52 and the dummy bit line 20 reaches the threshold voltage of the transistor 48. In this instance, each of the differential amplifier transistors 46 and 48 depends for its channel conductance on the potential at each of the bit line 10 and dummy bit line 20, respectively, so that the channel conductance of the second differential amplifier transistor 48 now becomes higher than that of the first differential amplifier transistor 48 with a higher potential present at the dummy bit line 20 than at the bit line 10. The transistor 48 being thus higher in channel conductance than the transistor 48, the charges which have been accumulated at the second sense node 44 are passed to the ground line at a higher rate through the transistor 48 than the charges passed from the first sense node 42 to the ground line through the transistor 46. This means that the potential at the second sense node 44 drops at a higher rate than the potential at the first sense node 42 as aill be seen from curves $E_{42}$ and $E_{44}$ in FIG. 2. It therefore follows that the gate voltage for the p-channel first feedback transistor 38 exceeds the threshold voltage of the transistor 38 before the gate voltage for the p-channel second feedback transistor 40 is to be permitted to exceed the threshold voltage of the transistor 40. At a point of time the gate voltage for the first feedback transistor 38 is reduced beyond the threshold voltage of the feedback transistor 38, the transistor 38 is turned on as at time $t_5$ (FIG. 2) so that the potential at the first sense node 42 begins to rise toward the supply voltage $V_{DD}$ as will be seen from curve $E_{42}$ in FIG. 2. After time $t_5$, the difference between the potentials at the first and second sense nodes 42 and 44 thus increases at an abruptly increased rate as will be also seen from curves $E_{42}$ and $E_{44}$ in FIG. 2. Such a growing difference between the potentials at the sense nodes 42 and 44 is detected by the output generator circuit 58 through the lines 54 and 56 and drives the output generator circuit 58 to produce an output signal $S_{OUT}$ indicative of the logic "0" bit of data stored in the memory cell 16. Indicated by curves $E_{10}$ and $E_{20}$ are the potentials at the bit line 10 and dummy bit line 20, respectively.

If the row select signal $S_W$ of a high level produced by the row address decoder 26 is supplied to the word line 14 with the bit line 10 also selected by the column address decoder, then the memory cell 18 storing the logic "1" bit of data is selected out of the memory cells associated with the bit line 10. In the absence of an operative field-effect transistor forming the particular memory cell 18, the potential at the bit line 10 remains at the level approximating the supply voltage $V_{DD}$ in the presence of the row select signal $S_W$ of the high level at the word line 14. On the other hand, the potential of the dummy bit line 20 drops through the transistor forming the dummy cell 22 activated by the signal $S_{WD}$ of a high level. The channel conductance of the first differential amplifier transistor 46 thus remains higher than that of the second differential amplifier transistor 48 so that the charges which have been accumulated at the first sense node 42 are passed to the ground line at a higher rate through the transistor 46 than the charges passed from the second sense node 44 to the ground line through the transistor 48. This means that the potential at the first sense node 42 drops at a higher rate than the potential at the second sense node 44 and accordingly that the gate voltage for the second feedback transistor 40 exceeds the threshold voltage of the transistor 40 before the gate voltage for the first feedback transistor 38 is to be permitted to exceed the threshold voltage of the transistor 38. At a point of time the gate voltage for the second feedback transistor 40 is reduced beyond the threshold voltage of the transistor 40, the transistor 40 is turned on so that the potential at the second sense node 44 begins to rise toward the supply voltage $V_{DD}$. The difference between the potentials at the first and second sense nodes 42 and 44 is thus also amplified at an increased rate and is detected by the output generator circuit 58, which thus produces an output signal $S_{OUT}$ indicative of the logic "1" bit of data stored in the memory cell 18.

One of the outstanding features of the prior-art memory device constructed and arranged as hereinbefore described is that the bit line 10 and dummy bit line 20 are not directly connected to the sense nodes 42 and 44 but are connected thereto through the intermediary of the differential amplifier transistors 46 and 48, respectively. This is advantageous in that the device would not fail to correctly read the information represented by the potentials at the bit line 10 and dummy bit line 20 as would otherwise be caused due to the possible difference in stray capacitance between the lines 10 and 20. Such an advantage is however offset by a drawback which results from the arrangement in which the sense nodes 42 and 44 are connected directly to the output generator circuit 58. The output generator circuit 58 is required to retain its output signal $S_{OUT}$ for a certain period of time necessitated for the proper operation of the external units which receive the information supplied from the memory device. The difference produced between the potentials at the sense nodes 42 and 44 during each readout cycle of the device must be maintained throughout this period of time at a level correctly reflecting the information read from the selected memory cell during the particular readout cycle. The sense amplifier 32 of the memory device is for this reason required to remain active and accordingly continues to consume power throughout such a period of time. This not only results in a waste of power but may impair the performance reliability of the device due to generation of heat by the elements which are to be maintained active for a prolonged period of time during each cycle of operation of the device.

The present invention contemplates resolution of such a problem through provision of an improved semiconductor memory device featuring, inter alia, a sense amplifier which may be maintained active for a significantly reduced period of time during each readout cycle of the device.

DESCRIPTION OF THE PREFERRED EMBODIMENTS

Referring to FIG. 3 of the drawings, a dynamic sense amplifier embodying the present invention is shown provided in a read only memory device basically similar in construction to the memory device described with reference to FIG. 1. The memory device shown in FIG. 3 thus also comprises bit lines represented by a bit line 10, word lines represented by word lines 12 and 14, and memory cells represented by memory cells 16 and 18 as shown. The memory cell 16 is assumed to be of the type storing a logic "0" bit of data while the memory cell 18 assumed to be of the type storing a logic "1" bit of data. As previously discussed, each of the memory cells of the type storing logic "0" bits of data such as the cell 16 is implemented by an n-channel MOS field-effect transistor. Each of the memory cells of the type storing logic "1" bits of data such as the cell 18 is implemented by a device having a gate oxide layer which is so thick that the device could not act as a field-effect transistor. The field-effect transistor forming each memory cell storing a logic "0" bit of data has its drain connected to the associated bit line, its gate connected to the associated word line, and its source connected to a common ground line ($V_{SS}$).

The memory device shown in FIG. 3 further comprises dummy bit lines respectively associated with the individual bit lines and represented by a dummy bit line 20 particularly associated with the bit line 10. The dummy bit line 20 is associated with a dummy cell 22 implemented by an n-channel field-effect transistor having its drain connected to the dummy bit line 20, its source connected to the ground line, and its gate connected to a dummy word line 24 as shown. The word lines 12, 14, . . . and the dummy word line 24 are connected to output terminals of a row address decoder 26 responsive to row address signals $S_{AD}$ and operative to produce an active-high row select signals $S_W$ to select any one of the word lines 12, 14, . . . in addition to an active-high signal $S_{WD}$ to activate the dummy word line 24 during each readout cycle of the memory device. Though not shown in the drawings, the bit lines 10, . . . and the dummy bit lines 20, . . . are also connected to a column address decoder to select any one of the bit lines as well as the associated dummy bit lines during each readout cycle.

Each of the bit lines 10, . . . is further connected to a precharge transistor represented by a field-effect transistor 28 shown provided in association with the bit line 10, and each of the dummy bit lines 20, . . . connected to a precharge transistor represented by a field-effect transistor 30 in the shown arrangement. Each of the precharge transistors 28 and 30 has its drain connected to a voltage supply line for a positive supply voltage $V_{DD}$, its gate connected to a first clock supply line for an active-low clock signal $\bar{\phi}_P$, and its source connected to the bit line 10 or the dummy bit line 20. The supply voltage $V_{DD}$ is herein assumed to be 5 volts by way of example. Each of the precharge transistors 28 and 30 is provided by a p-channel MOS field-effect transistor and is activated by the clock signal $\bar{\phi}_P$ of a low level, which is thus used as an active-low precharge enable signal in the sense amplifier 62 embodying the present invention. Though not shown in the drawings, the precharge transistor similar to the precharge transistor 28 is also provided in association with each of the bit lines other than the shown bit line 10 and, likewise, a precharge transistor similar to the precharge transistor 30 is also provided in association with each of the dummy bit lines other than the shown dummy bit line 20.

The memory device embodying the present invention further comprises a sense amplifier 62 which largely consists of a differential amplifier network 64 provided between the bit line 10 and dummy bit line 20 and a signal latch network 66 provided between the differential amplifier network 64 and an output generator circuit 58.

The differential amplifier network 64 per se is constructed similarly to the sense amplifier 32 in the memory device described with reference to FIG. 1 and comprises first and second precharge transistors 34 and 36 and first and second feedback transistors 38 and 40, each of which is provided by a p-channel MOS field-effect transistor. The first and second precharge transistors 34 and 36 have their drains connected to the voltage supply line for the supply voltage $V_{DD}$, their gates connected to the first clock supply line for the clock signal $\bar{\phi}_P$, and their sources connected to first and second sense nodes 42 and 44, respectively. Each of the precharge transistors 34 and 36 is to be also activated by the clock signal $\bar{\phi}_P$ of a low level. The feedback transistors 38 and 40 have their drains connected to the voltage supply line and supply voltage $V_{DD}$, their gates respectively connected to the second and first sense nodes 44 and 42, and their sources connected to the first and second sense nodes 42 and 44, respectively. The differential amplifier network 64 further comprises first and second differential amplifier transistors 46 and 48 each of which is provided by an n-channel MOS field-effect transistor. The first and second differential amplifier transistors 46 and 48 have their drains respectively connected to the first and second sense nodes 42 and 44, their gates respectively connected to the bit line 10 and dummy bit line 20, and their sources jointly connected to the ground line through a discharge transistor 50. The discharge transistor 50, which is also provided by an n-channel MOS field-effect transistor, has its drain connected to the respective sources of the first and second differential amplifier transistors 46 and 48 through a common node 52, its gate connected to a second clock supply line for an active-high clock signal $\phi_{A1}$, and its source connected to the ground line. The discharge transistor 50 is thus activated by the clock signal $\phi_{A1}$ of a high level, which is used as an active-high first activating signal in the sense amplifier 62 of the memory device embodying the present invention. The first and second sense nodes 42 and 44 are connected via lines 54 and 56, respectively, to the output generator circuit 58 which is operative similarly to its counterpart in the prior-art arrangement described with reference to FIG. 1.

On the other hand, the signal latch network network 66 provided in accordance with the present invention comprises first and second precharge transistors 68 and 70 and first and second feedback transistors 72 and 74, each of which is also provided by a p-channel MOS field-effect transistor. The first and second precharge transistors 68 and 70 have their drains connected to the voltage supply line for the supply voltage $V_{DD}$, their gates connected to the clock supply line for the clock signal $\bar{\phi}_P$, and their sources connected to first and second output nodes 76 and 78, respectively. Each of the precharge transistors 68 and 70 is to be activated by the clock signal $\bar{\phi}_P$ of a low level. The first and second feedback transistors 72 and 74 have their drains connected to the voltage supply line for the supply voltage $V_{DD}$, their gates respectively connected to the second and first sense nodes 44 and 42, and their sources connected to the first and second output nodes 76 and 78, respectively. The signal latch network 66 further comprises first and second input transistors 80 and 82 each of which is provided by an n-channel MOS field-effect transistor. The first and second input transistors 80 and 82 have their drains respectively connected to the first and second output nodes 76 and 78 and their gates respectively connected to the first and second sense nodes 42 and 44 of the differential amplifier network 64 through lines 84 and 86. The input transistors 80 and 82 are connected in series with third and fourth feedback transistors 88 and 90 each of which is also provided by an n-channel MOS field-effect transistor. The third and fourth feedback transistors 88 and 90 have their drains respectively connected to the sources of the first and second input transistors 80 and 82, their gates respectively connected to the second and first output nodes 78 and 76, and their sources commonly connected to the ground line through a discharge transistor 92. Thus, the first output node 76 is connected to the gate of each of the second and fourth feedback transistors 74 and 90 and the second output node 78 is connected to the gate of each of the first and third feedback transistors 72 and 88 as shown. The discharge transistor 92, which is also provided by an n-channel MOS field-effect transistor, has its drain connected to the respective sources of the third and fourth feedback transistors 88 and 90 through a common node 94, its gate connected to a third clock supply line for an active-high clock signal $\phi_{A2}$, and its source connected to the ground line. The discharge transistor 92 is thus activated by the clock signal $\phi_{A2}$ of a high level, which is used as an active-high second activating signal in the sense amplifier 62 embodying the present invention.

The first and second output nodes 76 and 78 are further connected via lines 96 and 98, respectively, the input terminals of the output generator circuit 58. The sense amplifier 62 herein shown is one of a plurality of such sense amplifiers provided respectively in association with the bit lines including the shown bit line 10 and the dummy bit lines including the shown dummy bit line 20. Each of these sense amplifiers is also connected to the output generator circuit 58 via the lines 54 and 56 shown. The clock supply lines for the clock signal $\bar{\phi}_P$ used as the active-low precharge enable signal and the clock signals $\phi_{A1}$ and $\phi_{A2}$ used as the first and second activating signals are connected to output terminals of a timing generator circuit 100 which is adapted to output various timing signals including the clock signals $\bar{\phi}_P$, $\phi_{A1}$ and $\phi_{A2}$, as shown in FIG. 3A.

Operation of the memory device including the sense amplifier 62 thus constructed and arranged in accordance with the present invention will now be described with reference to FIGS. 3 and 3A and further to FIG. 4. For brevity of discussion, the description regarding the operation of the device will be made only in respect of the shown component elements associated with the bit line 10 and dummy bit line 20.

During each readout cycle of operation, the memory device operates similarly to the prior-art device described with reference to FIG. 1 to the extent that a difference is induced between the potentials at the first and second sense nodes 42 and 44 of the differential amplifier network 64 depending upon the logic state of the memory cell selected during the readout cycle.

At time $t_1$ when the clock signal $\bar{\phi}_P$ present at one output terminal of the timing generator circuit 100 swings to a low level as indicated by plot "A" in FIG. 4, each of the first and second precharge transistor 28 and 30 of the differential amplifier network 64 is driven to turn on. Accordingly, the bit line 10 and dummy bit line 20 thus begin to be precharged through the transistors 28 and 30, respectively, toward potentials approximately equal to the supply voltage $V_{DD}$ (5 volts), as indicated by plot "B" in FIG. 4. The clock signal $\bar{\phi}_P$ of the low level supplied as the active-low precharge enable signal to the gates of the precharge transistors 34 and 36 of the sense amplifier 32 drives each of the transistors 34 and 36 to turn on so that the first and second sense nodes 42 and 44 are precharged through the transistors 34 and 36, respectively, to a potential approximating the supply voltage $V_{DD}$. At time $t_1$, the potential at the common node 52 between the respective sources of the first and second differential amplifier transistors 46 and 48 also rises to a level approximating the supply voltage $V_{DD}$ as described with reference to FIGS. 1 and 2. In the signal latch network 66 of the sense amplifier 62 embodying the present invention, each of the first and second precharge transistors 68 and 70 is also driven to turn on in response to the clock signal $\bar{\phi}_P$ of the low level so that the first and second output nodes 76 and 78 are precharged through the transistors 68 and 70, respectively, toward a level also approximating the supply voltage $V_{DD}$. With such potentials established at the nodes 76 and 78, the n-channel third and fourth feedback transistors 88 and 90 having their gates connected to the nodes 90 and 88, respectively, are turned on with the first and second feedback transistors 72 and 74 maintained in non-conduction states. The potentials approximating the supply voltage $V_{DD}$ as established at the precharged first and second sense nodes 42 and 44 of the sense amplifier network 64, the n-channel first and second input transistors 80 and 82 of the signal latch network 66 also remain in conduction states. The potentials at the first and second output nodes 76 and 78 of the latch network 66 are thus passed respectively through the first and second input transistors 80 and 82 and the third and fourth feedback transistors 88 and 90 to the common node 94 of the latch network 66 so that the common node 94 is also precharged to a level approximating the supply voltage $V_{DD}$. In the absence of a voltage of a high level at the gate of the discharge transistor 92 at this point of time, the common node 94 of the signal latch network 66 is disconnected from the ground line. The clock signal $\bar{\phi}_P$ swings to a high level at time $t_2$ after the bit lie 10, dummy bit line 20, first and second sense nodes 42 and 44, common nodes 52, first and second output nodes 76 and 78 and common node 94 have thus been precharged to the levels each approximating the supply voltage $V_{DD}$.

For purposes of description, it is also assumed that the memory cell 16 storing the logic "0" bit data is selected during the current readout cycle of the device with the row select signal $S_W$ of a high level supplied to the word line 12 and the signal $S_{WD}$ of a high level supplied to the dummy word line 24 at time $t_3$, as indicated by plot "C" in FIG. 4. At time $t_3$, the n-channel field-effect transistor forming the logic "0" storing memory cell 16 and the n-channel transistor forming the dummy cell 24 are thus driven to turn on so that the bit line 10 and dummy bit line 20 are connected to the ground line. The channel conductance of the transistor forming the dummy cell 24 being approximately equal to one half of that of the transistor forming the memory cell 16 as previously noted, the potential at the dummy bit line 20 drops at a rate approximately equal to one half of the rate at which the potential at the bit line 10 drops. Then the clock signal $\phi_{A1}$ on the second clock supply line leading from the timing generator circuit 100 shifts to a high level and is supplied as the active-high first activating signal to the gate of the discharge transistor 50 at time $t_4$, as indicated by plot "D" in FIG. 4. The discharge transistor 50 of the differential amplifier network 64 is now turned on so that the potential at the common node 52 begins to drop from the level approximating the supply voltage $V_{DD}$ toward the ground level $V_{SS}$ through the transistor 50 as will be seen from curve $E_{52}$ in FIG. 4. Accordingly, the first differential amplifier transistor 46 is turned on when the voltage between the common node 52 and the bit line 10 reaches the threshold voltage of the transistor 46 and, likewise, the second differential amplifier transistor 48 is turned on when the voltage between the common node 52 and the dummy bit line 20 reaches the threshold voltage of the transistor 48. As discussed in regard to the prior-art arrangement of FIG. 1, the channel conductance of the second differential amplifier transistor 48 now becomes higher than that of the first differential amplifier transistor 48 with a higher potential present at the dummy bit line 20 than at the bit line 10. The charges which have been accumulated at the second sense node 44 are for this reason passed to the ground line at a higher rate through the transistor 48 than the charges passed from the first sense node 42 to the ground line through the transistor 46. As a consequence, the potential at the second sense node 44 drops at a higher rate than the potential at the first sense node 42 as will be seen from curves $E_{42}$ and $E_{44}$ in FIG. 4. The gate voltage for the p-channel first feedback transistor 38 thus exceeds the threshold voltage of the transistor 38 before the gate voltage for the p-channel second feedback transistor 40 is to be permitted to exceed the threshold voltage of the transistor 40. The transistor 38 is therefore turned on when the potential at the first sense node 42 begins to rise backwardly toward the supply voltage $V_{DD}$ so that the difference between the potentials at the sense nodes 42 and 44 increases at an abruptly increased rate as will be seen from curves $E_{42}$ and $E_{44}$ in FIG. 4. Indicated by curves $E_{10}$ and $E_{20}$ are the potentials at the bit line 10 and dummy bit line 20, respectively, and by curve $E_{52}$ is the potential at the common node 52.

At time $t_5$ when the difference between the potentials at the first and second sense nodes 42 and 44 has been expanded to a certain appreciable value, the clock signal $\phi_{A2}$ on the third clock supply line leading from the timing generator circuit 100 shifts to a high level and is supplied as the active-high second activating signal to the gate of the discharge transistor 92 of the signal latch network 66, as indicated by plot $E_{92}$ in FIG. 4. The discharge transistor 92 of the signal latch network 66 is now turned on so that the potential at the common node 94 begins to drop from the level approximating the supply voltage $V_{DD}$ toward the ground level $V_{SS}$ through the transistor 92 as will be seen from curve $E_{94}$ in FIG. 4. With the discharge transistor 92 turned on, furthermore, the charges which have been accumulated at the first output node 76 of the latch network 66 are passed to the ground line through the first input transistor 80 and the associated third feedback transistor 88 and further by way of the common node 94 and the discharge transistor 92. The charges which have been accumulated at the second output node 78 of the latch network 66 also tend to be passed to the ground line through the second input transistor 82 and the associated fourth feedback transistor 90 and further by way of the common node 94 and the discharge transistor 92. A higher potential having been established on the line 84 leading from the first sense node 42 of the differential amplifier network 64 than on the line 86 leading from the second sense node 4 of the network 64, the first input transistor 80 of the latch network 66 having its gate connected to the line 84 is currently higher in channel conductance than the second input transistor 80 of the network 66 having its gate connected to the line 86. Charges are for this reason passed to the ground line at a higher rate from the first output node 76 of the latch network 66 than from the second output node 78 of the network 66 after time $t_5$. It therefore follows that the potential at the first output node 76 of the signal latch network 66 drops at a high rate toward the ground level $V_{SS}$ through the transistors 80, 88 and 94 as will be seen from curve $E_{76}$ in FIG. 4. The drop in the potential at the first output node 76 gives rise to a decrease in the channel conductance of the fourth feedback transistor 90 having its gate connected to the node 76 and restrains the potential at the second output node 78 from being reduced through the transistors 82, 90 and 94. The result is that the potential at the second output node 78 is allowed to remain slightly lower than the level approximating the supply voltage $V_{DD}$ as will be seen from curve $E_{78}$ in FIG. 4.

When the potential at the first output node 76 of the signal latch network 66 is reduced to a value exceeding the threshold level of the second feedback transistor 74 of the network 66, the transistor 74 is turned on so that the potential at the second output node 78 is for a second time raised to the level approximating the supply voltage $V_{DD}$ through the transistor 74, as will be seen also from curve $E_{78}$ in FIG. 4. The increased potential thus established at the second output node 78 drives each of the second and third feedback transistors 72 and 88 to turn on. The results now are that, by a certain point of time $t_6$ after time $t_5$, the potential at the first output node 76 is fixed at the ground level $V_{SS}$ while the potential at the second output node 78 is fixed at the level approximating the supply voltage $V_{DD}$, as will be seen from curves $E_{76}$ and $E_{78}$ in FIG. 4. By this point of time $t_6$, the state indicating that the logic "0" bit of information read from the selected memory cell 16 is in this fashion "latched" in the signal latch network 66 in the form of the potential of the ground level $V_{SS}$ established at the first output node 76 and the potential approximating the supply voltage $V_{DD}$ at the second output node 78. Such a state of the signal latch network 66 is detected by the output generator circuit 58 through the lines 96 and 98 and drives the output generator circuit 58 to produce an output signal $S_{OUT}$ indicative of the logic "0" bit of data stored in the memory cell 16.

After the state indicating the logic "0" bit of information read from the selected memory cell 16 has once been latched in the signal latch network 66, the particular state is held in the latch network 66 until the discharge transistor 94 of the network 66 is turned off with the clock signal $\phi_{A2}$ shifted to the low level possibly toward or at the end of the current readout cycle. If it happens that the potentials at the first and second sense nodes 42 and 44 of the differential amplifier network 64 are caused to change during the priod of time intervening between time $t_6$ and the time at which the clock signal $\phi_{A2}$ is shifted to the low level, the information latched in the signal latch network 66 could not be affected by such changes in the potentials in the differential amplifier network 64. This means that the differential amplifier network 64 need not be maintained active after the time $t_6$ so that the clock signal $\phi_{A1}$ as the active-high first activating signal as well as the row select signal $S_W$ and the dummy bit line select signal $S_{WD}$ may be shifted to the low level at this particular point of time $t_6$ as indicated by plot D' in FIG. 4.

If the row select signal $S_W$ of a high level produced by the row address decoder 26 is supplied to the word line 14 with the bit line 10 also selected by the column address decoder, the potential at the first sense node 42 of the sense amplifier network 64 drops at a higher rate than the potential at the second sense node 44. The result is that, at time $t_6$, the potential at the first output node 76 is fixed at the level approximating the supply voltage $V_{DD}$ while the potential at the second output node 78 is fixed at the ground level $V_{SS}$. The state indicating that the logic "1" bit of information read from the selected memory cell 18 is thus latched in the signal latch network 66 and is detected by the output generator circuit 58, which is accordingly driven to produce an output signal $S_{OUT}$ indicative of the logic "1" bit of data stored in the memory cell 18.

FIG. 5 shows a modification of the signal latch network 66 of the sense amplifier 62 in the embodiment hereinbefore described with reference to FIGS. 3 and 4. In the modified signal latch network herein shown, n-channel field-effect MOS transistors 68' and 70' are used in lieu of the p-channel first and second precharge transistors 68 and 70, respectively, of the signal latch network 66 and n-channel field-effect MOS transistors 72' and 74' used in lieu of the p-channel first and second feedback transistors 72 and 74, respectively, of the signal latch network. In addition, the n-channel first and second input transistors 80 and 82 of the latch network 66 are replaced with p-chanell field-effect MOS transistors 80' and 82', respectively, and the n-channel third and fourth transistors 88 and 90 of the signal latch network 66 replaced with p-channel field-effect MOS transistors 88' and 90', respectively. Furthermore, a p-channel field-effect MOS transistor 92' is substituted for the n-channel discharge transistor 92 of the latch network 66.

In the transistor circuit thus constructed, the first and second precharge transistors 68' and 70' have their sources connected to the ground line $V_{SS}$, their gates connected to the clock supply line for a clock signal $\phi_P$, and their drains connected to the first and second output nodes 76 and 78, respectively. The clock signal $\phi_P$ is used as an active-high precharge enable signal for the precharge transistors 68' and 70' so that each of transistors 68' and 70' is to be activated by the clock signal $\phi_P$ of a high level. The first and second feedback transistors 72' and 74' have their sources connected to the ground line $V_{SS}$, their gates respectively connected to the second and first sense nodes 44 and 42, and their drains connected to the first and second output nodes 76 and 78, respectively. The first and second input transistors 80' and 82' have their sources respectively connected to the first and second output nodes 76 and 78 and their gates respectively connected to the first and second sense nodes 42 and 44 of the differential amplifier network 64 (FIG. 3) through lines 84 and 86. The third and fourth feedback transistors 88' and 90' have their sources respectively connected to the drains of the first and second input transistors 80' and 82', their gates respectively connected to the second and first output nodes 78 and 76, and their drains commonly connected to the voltage supply line for the supply voltage $V_{DD}$ of, for example, 5 volts through the discharge transistor 92'. The discharge transistor 92' has its source connected to the respective drains of the third and fourth feedback transistors 88' and 90' through the common node 94, its gate connected to a clock supply line for a clock signal $\bar{\phi}_{A2}$, and its drain connected to the voltage supply line for the supply voltage $V_{DD}$. The clock signal $\bar{\phi}_{A2}$ is used as an active-low second activating signal for the discharge transistor 92' which is, thus, to be activated by the clock signal $\bar{\phi}_{A2}$ of a low level. It will be apparent that the signal latch network constructed and arranged as hereinbefore described is an inverted version of the latch network 66 in the embodiment described with reference to FIGS. 3 and 4 and is therefore operative essentially in similar manners to the signal latch network 66.

In the embodiment shown in FIG. 3, furthermore, both the precharge transistors 34 and 36 of the differential amplifier network 64 and the precharge transistors 68 and 70 of the signal latch network 66 as well as precharge transistors 28 and 30 associated with the bit line 10 and dummy bit line 20 are to be activated commonly by the clock signal $\bar{\phi}_P$ used as the active-low precharge enable signal. If desired, however, two different precharge enable signals may be used for these precharge transistors, consisting of an active-low first precharge enable signal $\bar{\phi}_{P1}$ for each of the precharge transistors 28 and 30 associated with the bit line 10 and dummy bit line 20 and the precharge transistors 34 and 36 of the differential amplifier network 64 and an active-low second precharge enable signal $\bar{\phi}_{P2}$ for each of the precharge transistors 68 and 70 of the signal latch network 66. FIG. 6 shows such an arrangement modified from the embodiment described with reference to FIGS. 3 and 4. In the arrangement herein shown, the first precharge enable signal $\bar{\phi}_{P1}$ is to swing to a high level at a point of time (indicated at $t_{12}$ in FIG. 7) coincident with the risetime $t_2$ of the precharge enable signal $\bar{\phi}_P$ used in the embodiment of FIG. 3 and to swing to a low level at a point of time (indicated at $t_{17}$ in FIG. 7) slightly later than the falltime $t_6$ of the first precharge enable signal $\bar{\phi}_{P1}$ used in the embodiment of FIG. 3. The second precharge enable signal $\bar{\phi}_{P2}$ is to swing to low and high levels at points of time (respectively indicated at $t_{11}$ and $t_{12}$ (or at $t_{21}$ and $t_{22}$ for the subsequent cycle) in FIG. 7) coincident with the falltime and risetime $t_1$ and $t_2$ of the precharge enable signal $\bar{\phi}_P$ used in the embodiment of FIG. 3, the first precharge enable signal $\bar{\phi}_{P1}$ thus swinging to a high level simultaneously with the second precharge enable signal $\bar{\phi}_{P2}$. In FIG. 7, the times $t_{11}, t_{12}, \ldots t_{16}$ correspond to the times $t_1, t_2, \ldots t_6$, respectively, indicated in FIG. 4. The clock supply lines for the clock signals $\bar{\phi}_{P1}$ and $\bar{\phi}_{P2}$ used as the active-low first and second precharge enable signals and the clock signals $\phi_{A1}$ and $\bar{\phi}_{A2}$ used as the first and second activating signals are connected to output terminals of a timing generator circuit 100', as shown in FIG. 6A.

If the clock signal $\phi_{A1}$ used as the active-high first activating signal is to be shifted to the low level at time $t_{16}$ as previously noted in regard to the embodiment of FIG. 3 (wherein time $t_6$ corresponds to this time $t_{16}$), the clock signal $\bar{\phi}_{P1}$ used as the active-low first precharge enable signal thus swings to the low level at time $t_{17}$ slightly later than the time $t_{16}$ as indicated by plot "F".

This means that the precharge for the bit line 10, dummy bit line 20 and the first and second sense nodes 42 and 44 for the readout cycle subsequent to the current readout cycle can be started immediately after the differential amplifier network 64 has been inactivated for the current readout cycle as at a certain point of time (indicated at $t_{15/16}$) prior to the time $t_{17}$. This is useful for the further reduction of the period of time for the precharge for the bit line 10, dummy bit line 20 and differential amplifier network 64 during each readout cycle of operation of the device and accordingly for coping with the increased stray capacitance of the bit lines and dummy bit lines in a memory device with a large capacity.

From the foregoing description it will have been understood that the memory device embodying the present invention as shown in FIG. 3 operates during each readout cycle of operation of the device largely as follows:

(1) The differential amplifier network 64 is activated by the clock signal $\phi_{A1}$ used as the first activating signal to produce between the potentials at the first and second sense nodes 42 and 44 a difference which reflects, or indicates, the potential on the bit line 10 and accordingly the logic state of the memory cell selected.

(2) Immediately upon establishment of such a potential difference between the first and second sense nodes 42 and 44 of the differential amplifier network 64, the signal latch network 66 has the potential difference latched therein in response to the clock signal $\phi_{A2}$ used as the second activating signal.

After the potential difference reflecting the logic state of the selected memory cell has thus been latched in the signal latch network 66, the sense nodes 42 and 44 have no control over the state of the latch network 66 so that the differential amplifier network 64 may be deactivated without respect to the period of time for which the output signal $S_{OUT}$ from the output generator circuit 58 is required to last during each readout cycle. The differential amplifier network 64 thus suffices to remain active only for the period of time intervening between the time ($t_5$ in FIG. 4) at which the first activating signal $\phi_{A1}$ is supplied to the discharge transistor 52 of the differential amplifier network 64 and the time ($t_6$ in FIG. 4) at which the second activating signal $\phi_{A2}$ is supplied to the discharge transistor 92 of the signal latch network 66. The differential amplifier network 64 is for this reason permitted to remain active for a reduced period of time as compared with the sense amplifier of a prior-art memory device of the described nature and is useful for realizing significant reduction in the amount of power to be dissipated by the sense amplifier and accordingly in the amount of heat to be generated by the memory device during each cycle of operation of the device.

What is claimed is:

1. A semiconductor device comprising:
   (a) a plurality of first lines and a plurality of second lines respectively associated with said first lines,
   (b) a plurality of memory cells arranged in association with each of said first lines,
   (c) a dummy cell arranged in association with each of said second lines,
   (d) differential amplifier means responsive to a first activating signal for comparing the potential at one of said first lines with the potential at the associated one of said second lines and producing one of two substantially complementary signals selectively depending upon the relationship between the potentials compared, and
   (e) a signal latch circuit including a switching circuit responsive to a second activating signal and to each of said complementary signals for separating said differential amplifier circuit from said signal latch circuit, said signal latch circuit responsive to the signal from said switching circuit for producing one of two output signals respectively corresponding to said complementary signals produced by said differential amplifier circuit, said signal latch circuit being operative to have said one of the output signals latched therein for a controlled period of time after the particular output signal has been produced by said signal latch circuit.

2. A semiconductor memory device as set forth in claim 1, in which said differential amplifier means has two output terminals between which one of said substantially complementary signals are to appear selectively, said signal latch means comprising
   (1) first and second output nodes between which said one of said output signals latched in said signal latch means is to appear,
   (2) first and second input transistors each having an input terminal, an output terminal and a control terminal, the control terminals of the first and second input transistors being respectively connected to said output terminals of said differential amplifier means and the input terminals of the first and second input transistors being connected to said first and second output nodes, respectively,
   (3) first and second feedback transistors each having an input terminal, an output terminal and a control terminal, the input terminal of each of the first and second feedback transistors being connected to a first voltage source, the output terminals of the first and second feedback transistors being connected to the input terminals of said first and second input transistors through said first and second output nodes, respectively, and the control terminals of the first and second feedback transistors being connected to said second and first output nodes, respectively,
   (4) third and fourth feedback transistors each having an input terminal, an output terminal and a control terminal, the input terminals of the third and fourth feedback transistors being connected to the output terminals of said first and second input transistors, respectively, and the control terminals of the third and fourth feedback transistors being connected to said second and first output nodes, respectively, and
   (5) a discharge transistor having an input terminal connected to the output terminals of said third and fourth feedback transistors, an output terminal connected to a second voltage source, and a control terminal connected to a source of said second activating signal.

3. A semiconductor memory device comprising:
   (a) a plurality of respectively associated first and second lines,
   (b) a plurality of memory cells arranged in association with said first lines,
   (c) a plurality of dummy cells arranged in association with said second lines,
   (d) a differential amplifier circuit responsive to a first activating signal for comparing a potential at one of said first lines with a potential at an associated one of said second lines and producing one of two substantially complementary signals selectively depending upon the relationship between the potentials compared, said differential amplifier means having two output terminals between which one of said substantially complementary signals appear, (e) a signal latch circuit responsive to a second activating signal and to each of said complementary signals for producing one of two output signals respectively corresponding to said complementary signals produced by said differential amplifier circuit, said signal latch circuit being operative to have said one of the output signals latched therein for a controlled period of time after the particular output signal has been produced by the signal latch circuit, said signal latch circuit including:
  i. first and second output nodes between which said one of said latched output signals appears,
  ii. first and second input transistors each having control terminals being respectively connected to said output terminals of said differential amplifier circuit and input terminals connected to said first and second output nodes, respectively,
  iii. first and second feedback transistors each having input terminals connected to a first voltage source, output terminals connected to said input terminals of said first and second input transistors, respectively, and control terminals connected to said second and first output nodes, respectively,
  iv. third and fourth feedback transistors each having input terminals connected to the output terminals of said first and second input transistors, respectively, and control terminals connected to said second and first output nodes, respectively, and
  v. a discharge transistor having an input terminal connected to the output terminals of said third and fourth feedback transistors, an output terminal connected to a second voltage source, and a control terminal connected to a source of said second activating signal.

4. A semiconductor memory device as set forth in claim 3, in which said differential amplifier circuit comprises:
  (a) first and second sense nodes between which one of the complementary signals produces by said differential amplifier circuit selectively appears,
  (b) first and second differential amplifier transistors each having control terminals respectively connected to one of said first lines and the associated one of said second lines and input terminals connected to said first and second sense nodes, respectively,
  (c) first and second feedback transistors each having input terminals connected to a first voltage source, output terminals connected to the input terminals of said first and second differential amplifier transistors, respectively, and control terminals connected to said second and first sense nodes, respectively, and
  (d) a discharge transistor having an input terminal connected to the output terminals of said first and second differential amplifier transistors, an output terminal connected to a second voltage source, and a control terminal connected to a source of said first activating signal.

5. A semiconductor memory device as set forth in claim 3, in which said signal latch circuit further comprises:
  (e) first and second precharge transistors each having input terminals connected to said first voltage source, output terminals connected to the input terminals of said first and second input transistors, respectively, and control terminals connected to a source of a precharge enable signal.

6. A semiconductor memory device as set forth in claim 4, wherein (1) said differential amplifier circuit further comprises first and second precharge transistors each having an input terminal being connected to said first voltage source, output terminals connected to the input terminals of said first and second input transistors, respectively, and control terminals connected to a source of a precharge enable and wherein (2) said signal latch circuit further comprises first and second precharge transistors each having an input terminal having each of their respective input terminals connected to said first voltage source, their respective output terminals connected to the input terminals of said first and second input transistors, respectively, and their control terminals connected to a source of a precharge enable signal.

7. A semiconductor memory device as set forth in claim 2, in which each of said transistors consists of a field-effect transistor having a drain as the input terminal, a source as the output terminal and a gate as the control terminal.

8. A semiconductor memory device as set forth in claim 4, in which each of said transistors consists of a field-effect transistor having a drain as the input terminal, a source as the output terminal and a gate as the control terminal, wherein each of said first and second feedback transistors comprises a p-channel field-effect transistor and each of said first and second input transistors, said third and fourth feedback transistors and said discharge transistor comprises an n-channel field-effect transistor.

9. A semiconductor memory device as set forth in claim 4 in which each of said transistors comprises a field-effect transistor having a drain as the input terminal, a source as the output terminal and a gate as the control terminal, wherein each of said first and second precharge transistors of said signal latch circuit comprises a p-channel field-effect transistor.

10. A semiconductor memory device as set forth in claim 4 in which each of said transistors comprises a field-effect transistor having a drain as the input terminal, a source as the output terminal and a gate as the control terminal, wherein each of said first and second precharge transistors of said signal latch circuit comprises an n-channel field-effect transistor.

* * * * *